United States Patent [19]
Carr et al.

[11] Patent Number: 5,637,905
[45] Date of Patent: Jun. 10, 1997

[54] HIGH TEMPERATURE, PRESSURE AND DISPLACEMENT MICROSENSOR

[75] Inventors: William N. Carr, W. Milford; Robert S. Okojie, South Orange, both of N.J.

[73] Assignee: New Jersey Institute of Technology, Newark, N.J.

[21] Appl. No.: 595,222

[22] Filed: Feb. 1, 1996

[51] Int. Cl.$^6$ ............................................. H01L 29/82
[52] U.S. Cl. .................... 257/418; 257/419; 257/420; 73/722; 73/728
[58] Field of Search ................................ 257/254, 417, 257/418, 419, 420; 73/715, 716, 717, 722, 723, 728

[56] References Cited

U.S. PATENT DOCUMENTS

| | | | |
|---|---|---|---|
| 4,287,501 | 9/1981 | Tominaga et al. | 257/419 X |
| 4,586,382 | 5/1986 | Sinha | 73/723 X |
| 4,984,046 | 1/1991 | Graeger et al. | 257/419 |
| 5,355,714 | 10/1994 | Suzuki et al. | 73/728 X |
| 5,481,919 | 1/1996 | Brandt, Jr. | 73/728 X |

FOREIGN PATENT DOCUMENTS

| 1643962 | 4/1991 | U.S.S.R. | 73/728 |
|---|---|---|---|

OTHER PUBLICATIONS

Sensors and Actuators, A21–A23 (1990), K. Peterson et al., "Ultra–Stable, High–temperature Pressure Sensors Using Silicon Fusion Bonding" (pp. 96–101).

Institute of Physics Publishing, Sensors Series (1993), K.T.V. Grattan et al.—"Sensors VI, Technology, Systems and Applications" (pp. 134–140).

*Primary Examiner*—William Mintel
*Attorney, Agent, or Firm*—Ohlandt, Greeley, Ruggiero & Perle

[57] ABSTRACT

A high-temperature, integrated, pressure sensor includes a single crystal semiconductor substrate that is provided with a recess in a first surface thereof, the recess bounded by a rim. A first coil structure is positioned within the recess and a pressure diaphragm, comprising a single-crystal semiconductor wafer is bounded about its periphery to the rim of the semiconductor substrate. The bonding is created by a glass interlayer between the pressure diaphragm and the semiconductor substrate. A second coil structure is positioned on the underside of the pressure diaphragm and is separated from the first coil structure. Electrical circuitry is connected to both coil structures and provides an output indicative of changes in inductive coupling between the coils.

6 Claims, 3 Drawing Sheets

HIGH TEMPERATURE, PRESSURE AND DISPLACEMENT MICROSENSOR

FIELD OF THE INVENTION

This invention relates to a semiconductor microsensor for the sensing of pressure and displacement and, more particularly, to such a microsensor which is particularly suited to high temperature environments.

BACKGROUND OF THE INVENTION

There is a demand for increasingly accurate and precise measurements of energy consumption inside combustion chambers and reactors. To achieve these goals, the sensing devices must interact directly with the sensing environment, and the data obtained must be transmitted with minimum distortion through interface circuitry to a measurement device. Since typical temperatures in such chambers usually exceed 125 degrees C., device reliability and survivability is questionable for most conventional piezo-resistive sensors.

Efforts have been made to increase the effective operating temperature of piezo-resistive pressure sensors. Petersen et al. describe a piezo-resistive, silicon-based pressure sensor that is operable at temperatures as high as 250° C. Such operation is made possible through the use of a silicon fusion bonding process in which resistors from one wafer are bonded to an oxidized surface of a second wafer. The intermediate oxide layer electrically isolates the resistors and provides a high-temperature capability. The Petersen et al. work is reported in "Ultra-Stable, High-Temperature Pressure Sensor Using Silicon Fusion Bonding," Sensors and Actuators, A21–A23 (1990) pages 96–101.

Substantially all reported sensor devices for high temperature applications still retain parameters that are sensitive to the high temperatures. In such devices, problems of redistributed impurity concentration profile, leakage current, and strain-inducing thermal coefficient mismatches have been reduced, but not eliminated.

Applicants have previously disclosed a silicon-based pressure sensor suitable for operation in a high-temperature environment of 650° C. (see "An Inductively Coupled High Temperature Silicon Pressure Sensor", Proceedings of the Sixth Conference on Sensors and Their Applications, 15 Sep. 1993, edited by Grattan, pages 135–140). FIG. 1 hereof is a sectional diagram of the high temperature pressure sensor as aforedescribed. The starting material for the sensor device was a silicon wafer 10, into which a cavity was anisotropically etched.

A silicon dioxide layer 12 was grown on the etched wafer, followed by the sputtering of a tantalum silicide layer over the oxide. The tantalum silicide layer was then masked and dry etched to form a secondary coil 14. Thereafter, silicon nitride was deposited to isolate the coil windings. The cavity was then filled with sacrificial phospho-silicate glass and planarized at the rim. A further nitride layer was deposited on the sacrificial phospho-silicate glass and a tantalum silicide conductive layer deposit sputtered thereon. Thereafter, the tantalum silicide layer was masked and etched to form a primary winding 16 which was subsequently insulated by an additional nitride layer. A one-micron polysilicon layer 18 was then deposited to form a diaphragm over primary winding 16. Thereafter, the phospho-silicate glass was etched to form cavity 20.

While the structure shown in FIG. 1 operated satisfactorily, it was found that thermal co-efficient of expansion differences between silicon wafer 10 and polysilicon layer 18 created problems at high operating temperatures. More specifically, at high temperatures, differential expansion between silicon wafer 10 and polysilicon layer 18 caused a buckling of polysilicon layer 18.

It is an object of this invention to provide an improved high-temperature pressure sensor wherein thermal mismatches are substantially avoided.

It is another object of this invention to provide a high-temperature pressure sensor which is adapted to sense differential pressures as well as absolute pressures.

SUMMARY OF THE INVENTION

A high-temperature, integrated, pressure sensor includes a single crystal semiconductor substrate that is provided with a recess in a first surface thereof, the recess bounded by a rim. A first coil structure is positioned within the recess and a pressure diaphragm, comprising a single-crystal semiconductor wafer is bounded about its periphery to the rim of the semiconductor substrate. The bonding is created by a glass interlayer between the pressure diaphragm and the semiconductor substrate. A second coil structure is positioned on the underside of the pressure diaphragm and is separated from the first coil structure. Electrical circuitry is connected to both coil structures and provides an output indicative of changes in inductive coupling between the coils.

DETAILED DESCRIPTION OF THE INVENTION

Figure 2:
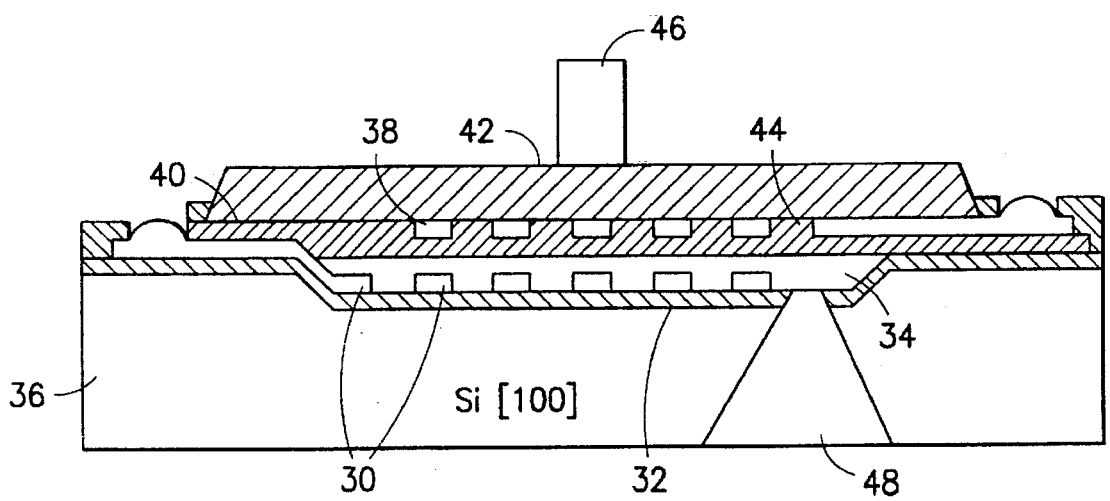
FIG. 2 is a sectional view of a high-temperature pressure and displacement microsensor incorporating the invention hereof.

Referring to FIG. 2, a primary coil 30 rests on a silicon dioxide layer 32 which in turn covers a cavity 34 etched into handle wafer 36. A secondary coil 38 is positioned on the underside of a diaphragm wafer 42, separated therefrom by a thin oxide layer 40. Both diaphragm wafer 42 and handle wafer 36 are preferably constructed out of N-type [100] single-crystal silicon. A pyrex glass layer 44 covers the lowermost surface of diaphragm wafer 42 (and secondary coil 38) and further bonds diaphragm wafer 42 to handle wafer 36 about the rim of recess 34). Contact pads 43 and 45 for primary coil 30 and secondary coil 38 are realized by using buffered hydrofluoric acid to etch away pyrex glass layer 44 and any oxide layers resident thereon.

Figure 3:
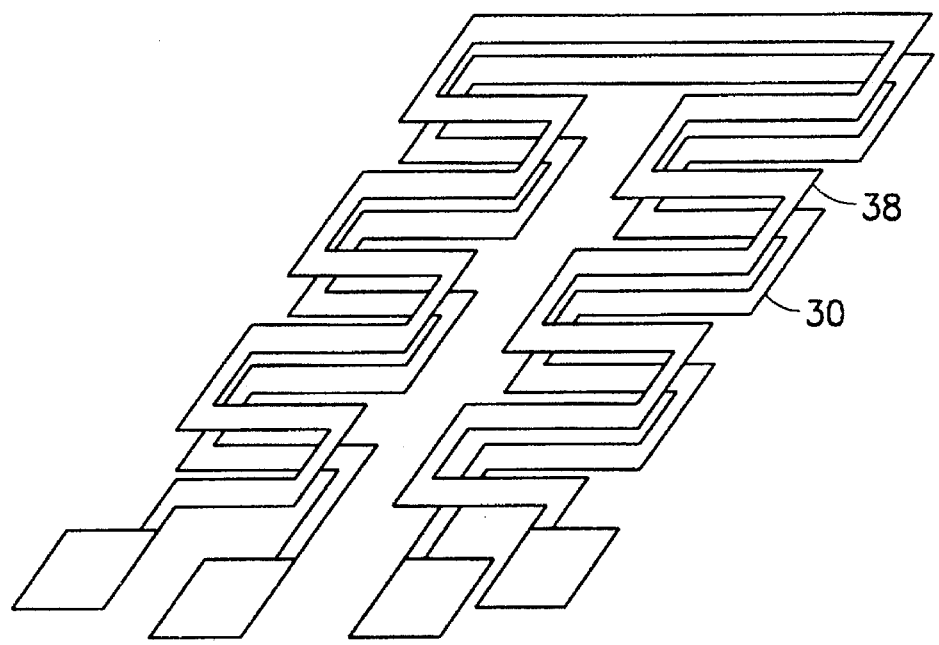
FIG. 3 is perspective view of primary and secondary coils employed in the structure of FIG. 2.

FIG. 3 is a perspective view of primary coil 30 and secondary coil 38, as they are resident within recess 34. During the fabrication phase, handle wafer 36 is processed independently of diaphragm wafer 42. Once the coil structures are resident on the opposed surfaces of handle wafer 36 and diaphragm wafer 42, and the pyrex glass layer 44 is present on the underside of diaphragm wafer 42, the two wafers are brought together and bonded by a liquefaction of pyrex glass layer 44.

When the pressure sensor of FIG. 2 is employed to sense absolute pressure, recess 34 is sealed to external pressure. If the sensor of FIG. 2 is to be employed in sensing a physical deflection, a plunger 46 is appended to the uppermost surface of diaphragm wafer 42. By contrast, if the pressure sensor is to be used in a liquid environment, plunger 46 may be dispense with. If the device is to be employed to sense differential pressure, an opening 48 is provided in handle wafer 36 to enable the pressure within recess 34 to equalize with the pressure on the lowermost surface of the device. Under such circumstances, diaphragm wafer 42 is isolated from the pressure in existence at the lowermost surface of the device and is exposed to a second ambient having a possibly different pressure level.

Figure 4:
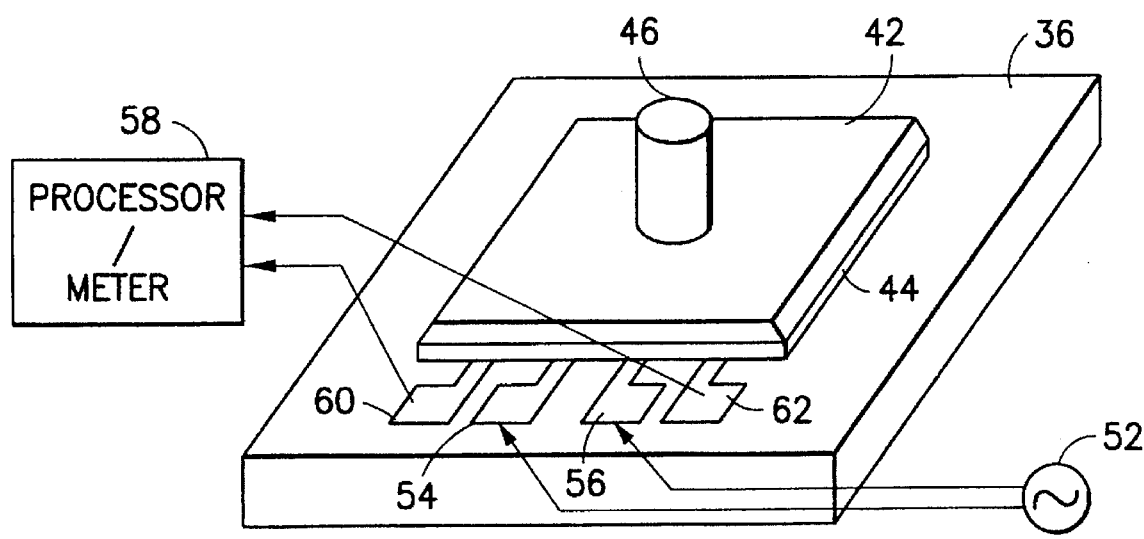
FIG. 4 is a perspective view of the sensor structure shown in FIG. 2.

FIG. 4 is a schematic, isometric view of a sensor device incorporating the invention hereof and the coil structure of FIG. 3. An AC source 52 applies signals to primary coil 30 via contacts 54, 56. Signals induced by primary coil 30 into secondary coil 38 are sensed by processor/meter 58 via output contacts 60, 62. As pressure varies on diaphragm wafer 42, the physical distance between primary coil 30 and secondary coil 38 is altered. As a result, the level of induced potential in secondary coil 38 changes, which change is sensed by processor/meter 58 as an indication of pressure value.

Figure 1:
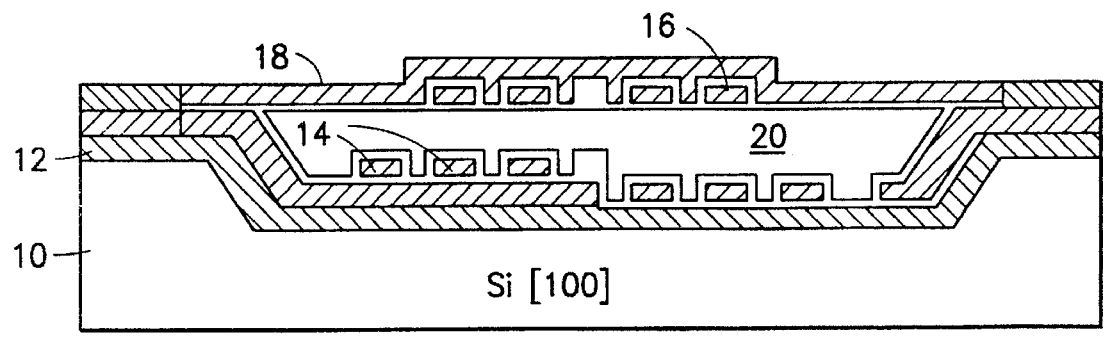
FIG. 1 is a sectional view of a prior art high temperature pressure and displacement microsensor.

A principal feature of the structure shown in FIGS. 2–4 is the fact that diaphragm wafer 42 is constructed from the same single crystal semiconductor material as handle wafer 36, thereby making identical their coefficients of thermal expansion. Thus, at elevated temperatures, there is little or no differential movement between diaphragm wafer 44 and handle wafer 36, overcoming the differential expansion problem present in the prior art structure of FIG. 1.

Handle wafer 36 and diaphragm wafer 44 are preferably bonded by the use of a layer of Pyrex glass (No. 7740, Corning Glass Co.). Output contact pads are automatically revealed at the completion of the formation of diaphragm wafer 42 by a wet chemical etch and dip in a buffered HF solution. The materials for primary and secondary coils 30 and 38 are chosen in accordance with the expected temperature of operation. When the sensor is to be operated at temperatures around 300° C., aluminum preferred. When the sensor is to be operated at temperatures in excess of 600° C., silicides such as tantalum silicide, tungsten silicide, platinum silicide and high temperature metals such as palladium and platinum are preferred. Platinum silicide is the most preferred material as it is stable at 800° C. and can be directly wire bonded.

Because there is no P-N junction in the sensor structure and all materials used in the structure can withstand high temperature, the sensor can be operated at temperatures in excess of 600° C. The limiting factor is the onset of plastic creep in the silicon itself. The symmetrical arrangement of the sensor design also enhances temperature stability in high temperature applications.

The fabrication of the sensor of FIG. 2–4 commences by etching out a cavity in handle wafer 36 using a wet anisotropic chemical etch procedure. Diaphragm wafer 42 is heavily boron diffused to define the diaphragm area. After a thermal oxide is grown on both handle wafer 36 and diaphragm wafer 42, a metal layer is sputter deposited onto the two wafers. Next, both the primary and secondary coils are patterned. A Pyrex glass intermediate layer, of thickness approximately 1 micron, is then deposited onto the surface of diaphragm wafer 42 via a sputtering action. The thickness of Pyrex glass layer 44 is typically more than the thickness of two metal layers. Next, handle wafer 36 and diaphragm wafer 42 are aligned, pressed together and then subjected to a 900° C. atmosphere for 15 minutes.

As indicated above, the Pyrex glass selected for glass layer 44 is preferably Corning 7740 because it has a thermal expansion of $3.4 \times 10^{-6}$/K and is close to that of silicon ($2.6 \times 10^{-6}$/K). Because the thickness of secondary coil 38 is thin compared with the thickness of glass layer 44, the properties of the sandwich structure are mainly governed by diaphragm wafer 42 and glass layer 44. This assures thermal stability of the sensor device at high temperatures.

As indicated above, a pressure sensor incorporating the invention hereof, operates using the principals of electromagnetic induction. An alternating current passing through primary coil 30 generates a magnetic field that creates a flux and induces a voltage in secondary coil 38. Upon displacement or application of pressure to diaphragm wafer 42, the gap between the two coils is altered and the induced voltage changes on secondary coil 38.

Figure 5:
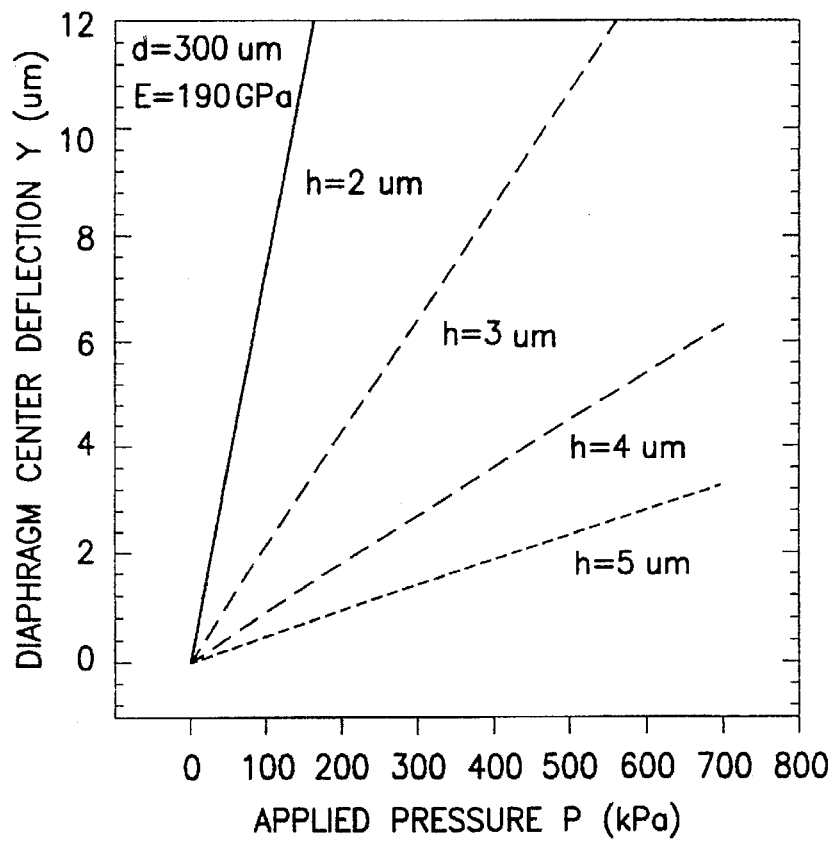
FIG. 5 is a plot of the relation of diaphragm displacement versus applied pressure for various thicknesses of diaphragm in the structure of FIG. 2.
Figure 6:
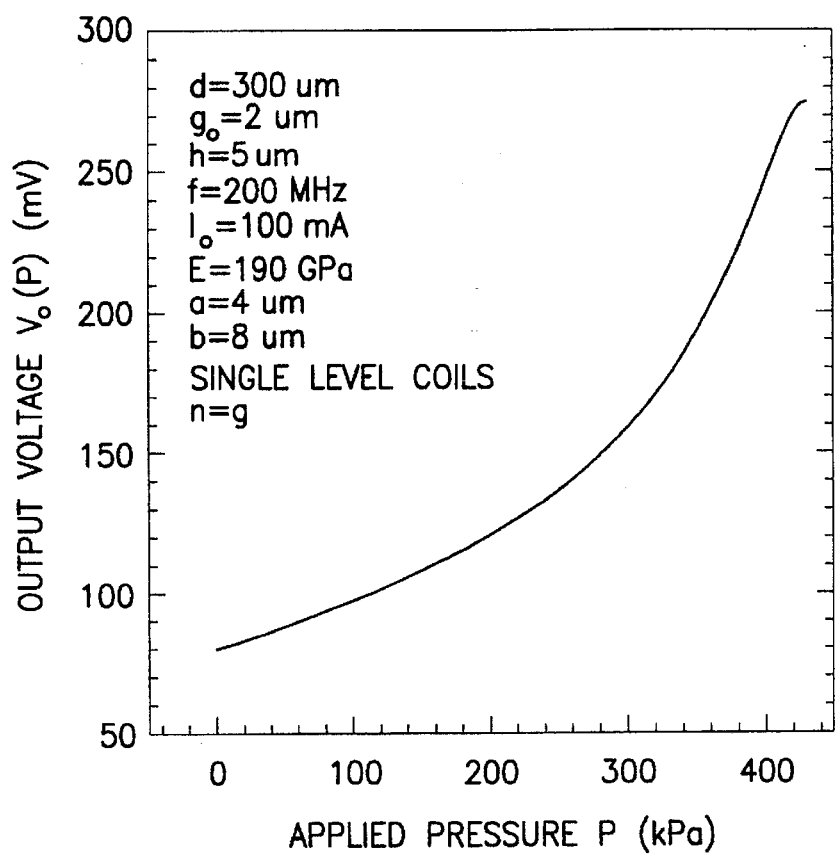
FIG. 6 is a plot of output voltage versus applied pressure for the structure of FIG. 2.

FIG. 5 is a plot of diaphragm center deflection y in microns versus applied pressure for different thicknesses of diaphragm wafer 42. It is assumed that diaphragm wafer 42 has a side length of 300 microns and is square in configuration. FIG. 6 illustrates a plot of output voltage as a function of applied pressure wherein the area of diaphragm wafer 42 is $300 \times 300$ microns$^2$, its thickness (h) is 5 microns, the spacing between coils ($g_o$) is 2 microns, Young's modulus (E) is 190 GPa, applied current $I_o$ is 100 mA and its frequency is 200 MHz.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

We claim:

1. A high temperature integrated pressure sensor comprising:

single crystal semiconductor substrate means having a recess in a first surface thereof, said recess bounded by a rim;

a first conductor structure positioned within said recess;

a pressure diaphragm having a periphery, and comprising a single crystal semiconductor wafer, both said wafer and said substrate means exhibiting identical coefficients of thermal expansion;

bonding means for joining said periphery of said pressure diaphragm to said rim so that one surface of said pressure diaphragm is positioned in opposition to, but separated from, said first conductor structure;

a second conductor structure positioned on said one surface and separated from said first conductor structure; and electrical means connected to said first conductor structure and said second conductor structure for providing an electrical output indicative of pressure applied to said pressure diaphragm.

2. The integrated pressure sensor as recited in claim 1, wherein said bonding means is an amorphous glass material which rigidly bonds said periphery to said rim.

3. The integrated pressure sensor as recited in claim 1, wherein an insulating layer covers said second conductor structure.

4. The integrated pressure sensor as recited in claim 1, wherein said first conductor structure and said second conductor structure are inductively coupled coils, and said electrical means comprising a signal source for applying a signal to one coil and measurement means coupled to a second coil for measuring a signal level induced therein from said one coil.

5. The integrated pressure sensor as recited in claim 4, wherein each conductor structure is comprised of a conductive material selected from the group consisting of: aluminum, polysilicon, platinum, palladium, tantalum, tungsten, and silicides of tantalum, cobalt and platinum.

6. The integrated pressure sensor as recited in claim 1, wherein said single crystal semiconductor substrate means includes an opening extending between said recess and a second surface of said substrate means, said opening enabling said recess to be at a pressure existing at said second surface, so that when said pressure diaphragm is exposed to a pressure that is different from said pressure existing at said second surface, said diaphragm is stressed in accordance with said pressures that are different.

* * * * *